(12) United States Patent
Wang

(10) Patent No.: US 8,063,986 B2
(45) Date of Patent: Nov. 22, 2011

(54) AUDIO CLOCK REGENERATOR WITH PRECISELY TRACKING MECHANISM

(75) Inventor: Hui-Min Wang, Tainan (TW)

(73) Assignee: Himax Technologies Limited (TW)

( * ) Notice: Subject to any disclaimer, the term of this patent is extended or adjusted under 35 U.S.C. 154(b) by 1205 days.

(21) Appl. No.: 11/757,829

(22) Filed: Jun. 4, 2007

(65) Prior Publication Data

US 2008/0298532 A1  Dec. 4, 2008

(51) Int. Cl.
*H04N 9/475* (2006.01)
*H04N 11/00* (2006.01)
*H03L 7/00* (2006.01)

(52) U.S. Cl. .................. 348/515; 348/537; 348/552

(58) Field of Classification Search .............. 348/515, 348/537
See application file for complete search history.

(56) References Cited

U.S. PATENT DOCUMENTS

| | | | |
|---|---|---|---|
| 6,914,637 B1 * | 7/2005 | Wolf et al. | 348/473 |
| 7,088,398 B1 * | 8/2006 | Wolf et al. | 348/423.1 |
| 7,792,152 B1 * | 9/2010 | Xu et al. | 370/503 |
| 2006/0209892 A1 * | 9/2006 | MacMullan et al. | 370/468 |
| 2007/0121008 A1 * | 5/2007 | Kanoh | 348/537 |
| 2007/0291856 A1 * | 12/2007 | Fastert et al. | 375/240.28 |
| 2008/0024661 A1 * | 1/2008 | Tung | 348/537 |
| 2008/0061854 A1 * | 3/2008 | Tung et al. | 327/291 |
| 2008/0106306 A1 * | 5/2008 | Keady et al. | 327/100 |
| 2008/0106312 A1 * | 5/2008 | Keady et al. | 327/179 |
| 2008/0106313 A1 * | 5/2008 | Keady et al. | 327/179 |
| 2008/0106314 A1 * | 5/2008 | Keady et al. | 327/179 |
| 2008/0109180 A1 * | 5/2008 | Keady et al. | 702/89 |
| 2008/0133249 A1 * | 6/2008 | Hashiguchi et al. | 704/500 |
| 2008/0198153 A1 * | 8/2008 | Yu et al. | 345/214 |
| 2009/0167366 A1 * | 7/2009 | Wang | 327/105 |
| 2010/0001773 A1 * | 1/2010 | Kato | 327/159 |
| 2010/0052746 A1 * | 3/2010 | Park et al. | 327/156 |
| 2010/0189104 A1 * | 7/2010 | Ichimura | 370/389 |
| 2010/0245663 A1 * | 9/2010 | Kawabata et al. | 348/441 |
| 2011/0075782 A1 * | 3/2011 | Zhang et al. | 375/376 |

* cited by examiner

*Primary Examiner* — Brian Yenke
(74) *Attorney, Agent, or Firm* — Baker & McKenzie LLP

(57) ABSTRACT

In an HDMI system, the clock regenerator proposed by the HDMI specification may suffer external noise because the input clock of a phase lock loop circuit in a sink device of the HDMI system is too slow. This slow input clock causes the phase lock loop circuit unable to adjust and reduce the jitter of an audio clock regenerated in the sink device. Therefore, one embodiment of the present invention provides a clock regenerator to extract the relationship between the regenerated audio clock and a video clock received by the sink device from other source devices. The clock regenerator may comprise a phase lock loop circuit, a recovery circuit, a crystal oscillator and a tracking circuit. The crystal oscillator generates a crystal clock. The phase lock loop circuit receives the crystal clock and regenerates an audio clock. The recovery circuit extracts the relationship between the audio clock and the received video clock. The tracking circuit tunes the frequency of the crystal clock based on the extracted relationship.

21 Claims, 3 Drawing Sheets

US 8,063,986 B2

AUDIO CLOCK REGENERATOR WITH PRECISELY TRACKING MECHANISM

FIELD OF THE INVENTION

This invention relates to a clock regenerator in a digital transmission system, and more particularly, to a clock recovery circuit with a phase lock loop circuit.

BACKGROUND OF THE INVENTION

There are many standards available for data transmission in home use apparatuses. For example, an RF cable is used to transmit TV signals from an antenna to a TV. An S-Video is another data transmission standard to transmit TV signals. There is also another data transmission standard that transmits TV signals with split color components. All these mentioned standards transmit signals in analog waveforms. It is commonly known to a person in the art that transmitting signals in analog waveforms comes with noise.

In order to overcome such disadvantage, several digital interfaces were introduced, e.g., Digital Visual Interface (DVI) or High-Definition Multimedia Interface (HDMI). The HDMI is the first interface that can carry uncompressed high definition video signals, compressed or uncompressed multi-channel audio signals, and intelligent format and command data. The HDMI specification can be backward compatible with the DVI. Also, HDMI interface is highly favored by movie makers who urge protection of their products from piracy. HDMI also allows users to control multiple consumer electronic devices with only one remote controller.

To communicate data digitally between two devices, it requires an accurate clock to synchronize data signals. There is usually a clock recovery circuit in the reception device that receives the clock from a transmitter device, generates an internal clock, and synchronizes the internal clock with the received clock. Therefore, the reception device can process the received data without errors. According to the HDMI specification, a clock recovery circuit needs not only to synchronize a received video clock but also to extract an audio clock according to the received video clock and few defined parameters, e.g., Cycle Time Stamp (CTS) and a factor parameter N.

In pages 75-79 of the High-Definition Multimedia Interface Specification Version 1.2, published on Aug. 22, 2005 by HDMI Licensing, LLC, the requirements for audio sample clock capture and regeneration are defined. The disclosure of which is hereby incorporated by reference.

FIG. 1 illustrates an audio clock regeneration model according to the HDMI specification. A source device 11 transmits TMDS (Transmission Minimized Differential Signaling) or video clock to a sink device 12. Meanwhile, a parameter CTS and a parameter N are transmitted within an Audio Clock Regeneration Packet from the source device 11 to the sink device 12. In some video source devices, the audio and video clocks are synchronized. There exits a rational (Integer divided by integer) relationship between these two clocks. In another situation, the audio and video clocks may be asynchronous. According to the HDMI specification, the sink device 12 shall also work in this environment by extracting the fractional relationship between these two clocks.

The source device 11 first determines the fractional relationship between the video clock and an audio reference clock (128*fs) where fs is an audio sample rate. The source device contains a register 15, a divider 13, and a counter 14 wherein the register 15 keeps the parameter N, the divider 13 divides the audio reference clock by the parameter N, and the counter 14 counts the cycle time of the divided audio reference clock based on the video clock. The exact relationship between the two clocks is described by the equation:

$$128 * f_s = f_{TMDS\_clock} * N / CTS.$$

The source device 11 sends the numerator and the denominator via the HDMI link to the sink device 12. The clock recovery circuit of the sink device 12 including a divider 16 and a frequency multiplier 17 wherein the divider 16 divides the incoming video (TMDS) clock by the parameter CTS, and then the frequency multiplier 17 increases frequency of the divided video (TMDS) clock to N times compared to the original frequency. Finally, a clock with a frequency within an audio frequency range and with synchronization of the received video clock is captured and regenerated.

FIG. 2 illustrates an optional architecture to implement an audio clock regeneration function that takes advantages of the N and CTS values. The frequency multiplier 17 is replaced by a conventional phase lock loop circuit including a phase detector 21, a low-pass filter 22, a VCO (Voltage Controlled Oscillator) 23, and a divider 24. It is well known to those skilled in the art that the conventional phase lock loop circuit can regenerate a synchronized clock. Therefore, the detailed operation of the conventional phase lock loop is ignored herein.

As mentioned in the page 76 of the mentioned HDMI specification, due to the asynchronous clocks, the variation of the parameter CTS creates large jitter. Although the HDMI Specification recommended several N and CTS values, it is still hard to obtain an audio clock with low jitter. For example, to obtain an audio clock with 32 kHz from a video clock with 25.2 MHz, the parameter CTS would be 25,200 if the N parameter were 4096 as recommended in the HDMI specification. The received video (TMDS) clock in the sink device 12 was divided by the parameter CTS and reduced to 1 kHz before entering the phase lock loop circuit.

The phase lock loop circuit could not adjust itself with a low frequency input, e.g., 1 kHz. The phase detector 21 detects the phase change and forces the low-pass filter 22 to change its voltage level, such that the VCO 23 can send a feedback clock through the divider 24 to the phase detector 21, and update an output clock which is synchronized to the input clock, e.g., the 1 kHz clock. With such a low input clock, the phase lock loop circuit adjusts itself per 1 ms which is the period of a 1 kHz clock. Thus, the accurate requirement 1000 ppm of the HDMI specification can not be easily achieved because the phase lock loop circuit can only adjust its phase slowly and noise may accumulate, either externally or internally, during this 1 ms waiting time.

The optional implementation of the clock recovery circuit in the sink device 12 according to the HDMI specification does not provide a low jitter clock recovery circuit. Therefore, it is an object of the present invention to provide a stable clock recovery circuit which also meets the requirements defined in the HDMI specification.

SUMMARY OF THE INVENTION

According to one embodiment of the present invention, there is a clock regenerator comprising: a phase lock loop circuit to receive a crystal clock and to regenerate an audio clock; a recovery circuit to receive a video clock and to compare the video clock with the audio clock in order to generate a recovery parameter; a crystal oscillator to generate the crystal clock; and a tracking circuit to receive a cycle parameter and to compare the recovery parameter with the cycle parameter to tune the crystal clock of the crystal oscillator.

The frequency of the crystal clock may be adjusted by the tracking circuit. The frequency may be adjusted when the cycle parameter is less or greater than the recovery parameter. In order to obtain a more accurate frequency, the tracking circuit accumulates the comparison result between the recovery parameter and the cycle parameter, and tunes the crystal clock of the crystal oscillator.

According to another embodiment of the present invention, there is a clock regenerator, comprising: a clock output; a clock input; a crystal clock; a phase lock loop circuit to receive the crystal clock and to regenerate the clock output; an extraction circuit to receive the clock output and to compare the clock output with the clock input to generate a first ratio parameter; a crystal oscillator to generate the crystal clock; and an adjustment circuit to receive a second ratio parameter and to compare the second ratio parameter with the first ratio parameter to adjust the crystal lock of the crystal oscillator.

According to another embodiment of the present invention, there is a sink device in an HDMI system comprising: a video clock and a cycle time parameter; an oscillator to generate a crystal clock; a phase lock loop circuit to regenerate an audio clock according to the crystal clock; a counter to extract the period of the audio clock based on the video clock; and a tracking circuit to compare the counting result of the counter with the cycle time parameter and to change the crystal clock of the oscillator.

According to another embodiment of the present invention, there is a clock recovery method for a sink device in an HDMI system comprising the steps of: receiving a video clock and a cycle time parameter; generating a crystal clock; regenerating an audio clock according to the crystal clock wherein the phase of the audio lock is synchronized with the crystal clock; extracting the period of the audio clock based on the video clock; comparing the extracted period to the cycle time parameter; and changing the crystal clock according to the comparison result between the extracted period and the cycle time parameter.

DESCRIPTION OF EMBODIMENTS OF THE INVENTION

The present invention provides a method and apparatus to precisely track a clock input and to regenerate a recovered clock output in a data transmission system.

Figure 1:
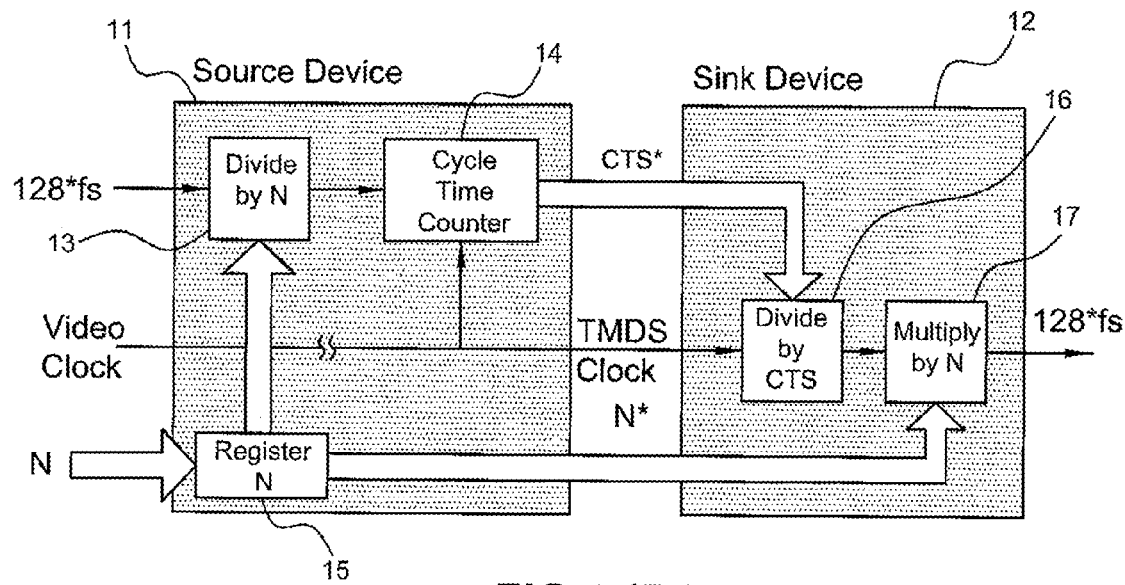
FIG. 1 is a diagram showing an audio clock regeneration model disclosed in the HDMI specification.
Figure 2:
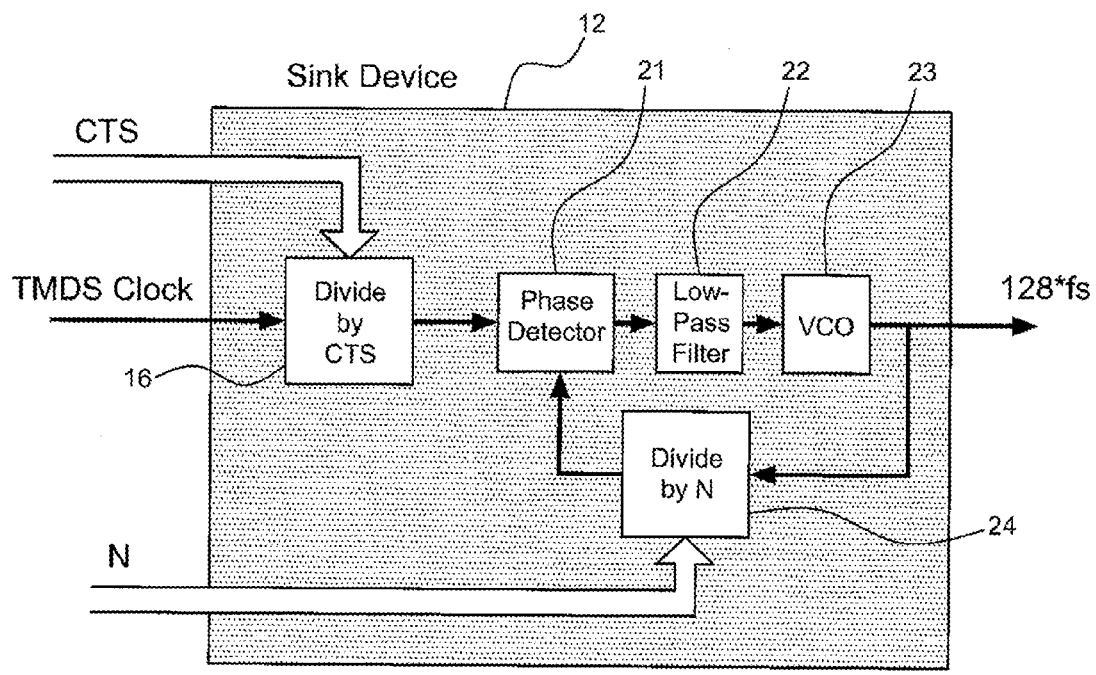
FIG. 2 is a diagram showing an optional implementation of a clock recovery circuit in the sink device suggested in the HDMI specification.
Figure 3:
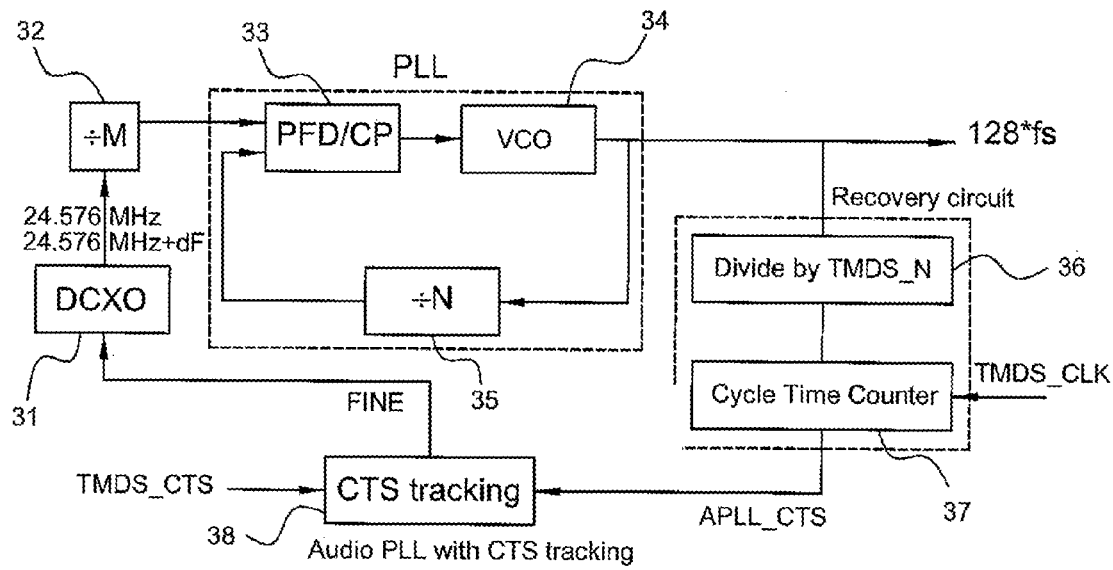
FIG. 3 illustrates one embodiment of the present invention to recover an audio clock from a video clock.

FIG. 3 illustrates an audio clock generator that recovers an audio clock (128*Fs) from a video clock TMDS_CLK with parameters TMDS_CTS and N according to one embodiment of the present invention. The audio clock regenerator comprises a phase lock loop circuit, a recovery circuit, a crystal oscillator 31 and a tracking circuit 38. The crystal oscillator 31 generates a crystal clock. For example, the crystal clock is 24.576 MHz. The generated crystal clock can be adjusted within a frequency range. In one embodiment, the crystal oscillator 31 may also be a digital controlled crystal oscillator. The crystal oscillator 31 may be an analog controlled crystal oscillator, for example, a voltage controlled crystal oscillator.

The clock regenerator further comprises a clock divider 32. The clock divider 32 divides the crystal clock generated from the crystal oscillator 31 by a parameter M which is a number close to the parameter TMDS_CTS. The clock regenerator not only receives the video clock TMDS_CLK, but also receives two parameters TMDS_CTS and N such that the expected audio clock (128*Fs) can be regenerated. The parameters TMDS_CTS and N represent the fractional relationship between the video clock TMDS_CLK and the audio clock (128*Fs). The audio clock (128*Fs) is usually within the frequency range from 1 MHz to 100 MHz wherein the Fs is the audio sample rate. For example, if the audio sample rate is 32 kHz, the required audio clock is about 4 MHz. For another example, if the audio sample rate is 192 kHz, the required audio clock is about 24 MHz.

The fractional relationship between the video clock TMDS_CLK and the regenerated audio clock (128*Fs) can be described by the following equation:

$$128*Fs = f_{TMDS\_CLK} * N / \text{TMDS\_CTS}.$$

The phase lock loop circuit receives the divided crystal clock and regenerates the audio clock (128*Fs). In this embodiment, the phase lock loop circuit comprises a PFD/CP (Phase Frequency Detector/Charge Pump) 33, a VCO (Voltage Controlled Oscillator) 34 and a loop divider 35. It is well known that the phase lock loop circuit adjusts the phase difference between the input clock and the regenerated output. The VCO 34 adjusts the audio clock (128*Fs) according to a reference voltage from the PFD/CP 33. The audio clock (128*Fs) becomes a feedback to the PFD/CP 33 after it is divided by the loop divider 35 wherein the divisor of the loop divider 35 is determined by the parameter N.

Moreover, the phase lock loop circuit may use other techniques to achieve the clock regeneration function. In this embodiment, the phase lock loop circuit uses Integer-N frequency synthesizer architecture. The phase lock loop circuit may also use Fractional-N synthesizer architecture. For another example, the phase lock loop circuit may use Multi-modulus Fractional-N or Multi-phase Fractional-N frequency synthesizer architecture such that the phase lock loop circuit can still operate if the parameter N is a fractional parameter. Therefore, the parameter N of the present invention is not limited to an integer number. In certain embodiments, the phase lock loop circuit may use a sigma-delta modulator to perform the Fractional-N frequency synthesis.

The recovery circuit comprises a recovery divider 36 and a cycle time counter 37. The recovery circuit provides a recovery cycle time stamp APLL_CTS value to the tracking circuit 38. The recovery divider 36 receives and divides the regenerated audio clock (128*Fs) by the parameter N. The cycle time counter 37 receives the video clock TMDS_CLK and extracts the relationship between the divided audio clock and the video clock TMDS_CLK. For example, the cycle time counter 37 may use the video clock TMDS_CLK as a basic clock to count the clock period of the divided audio clock since the video clock TMDS_CLK is a faster clock.

The tracking circuit 38 receives the regenerated (or recovery) cycle time stamp APLL_CTS and the cycle time stamp TMDS_CTS. The cycle time stamp TMDS_CTS is a reference parameter transmitted from other devices which accompanies the parameter N and the video clock TMDS_CLK. The regenerated cycle time stamp APLL_CTS is a regenerated parameter from the recovery circuit that extracts the relationship between the video clock TMDS_CLK and the regenerated audio clock (128*Fs). Therefore, if the relationship between the regenerated audio clock (128*Fs) and the video TMDS_CLK does not correspond to the reference parameters TMDS_CTS and N, the regenerated cycle time stamp APLL_CTS becomes a different value compared to the reference cycle time stamp TMDS_CTS.

The tracking circuit 38 outputs a control signal FINE to the crystal oscillator 31. The frequency of the crystal clock generated by the crystal oscillator 31 is adjusted according to the relationship between the reference cycle time stamp TMDS_CTS and the regenerated cycle time stamp APLL_CTS. In one embodiment, the crystal oscillator 31 is a digital controlled oscillator and the tracking circuit 38 outputs at least one digital signal to control the crystal oscillator 31. The digital signal may represent integer numbers or fractional numbers. In another embodiment, the crystal oscillator 31 may be an analog controlled oscillator and the tracking circuit 38 outputs at least one analog signal to control the crystal oscillator 31. The analog signal may use at least one voltage signal or current signal.

Accordingly, the recovery circuit and the tracking circuit form a recovery loop to correct the input clock of the phase lock loop circuit by adjusting the frequency of the crystal clock. This recovery loop makes sure that the regenerated audio clock (128*Fs) relates to the video clock TMDS_CLK according to the reference parameters TMDS_CTS and N.

Figure 4:
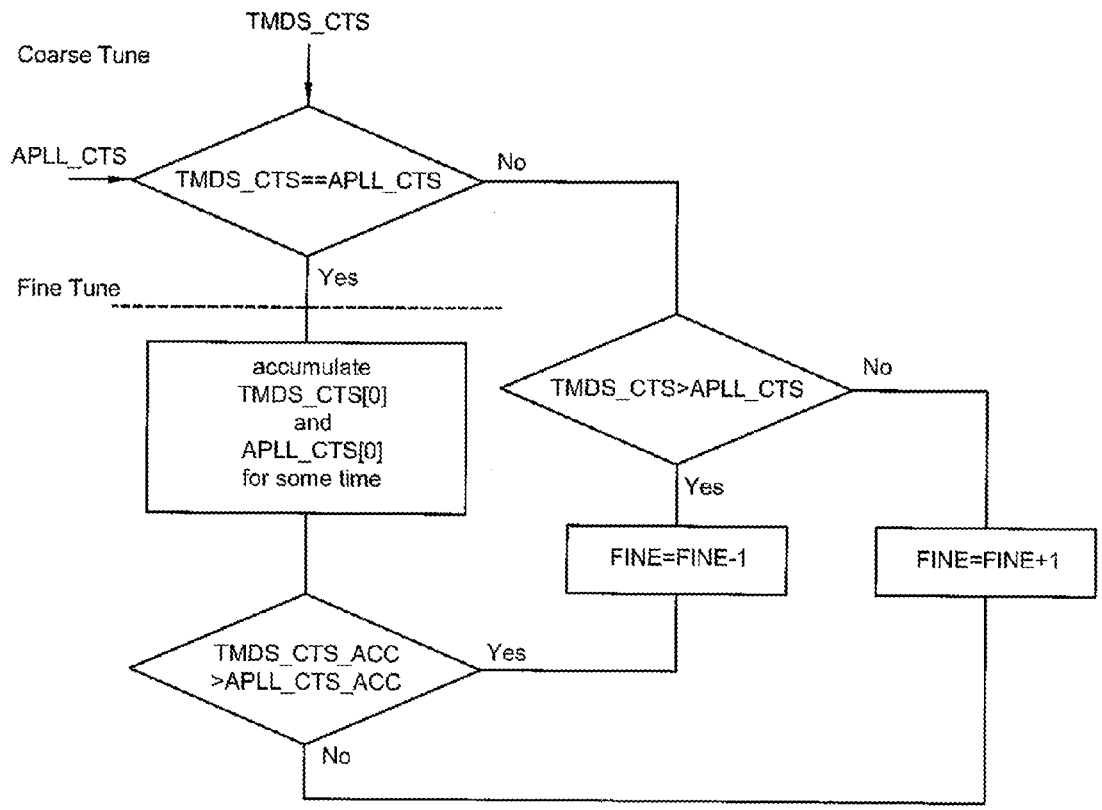
FIG. 4 shows a CTS tracking algorithm that includes the operations for coarse tune and fine tune of the crystal clock according to one embodiment of the invention.

FIG. 4 shows a CTS tracking algorithm that includes the operations for the coarse tune and the fine tune of the crystal clock. In one embodiment, a CTS tracking method comprises a coarse tune step and a fine tune step. In the coarse tune step, the tracking circuit 38 decreases the control signal FINE by one if the reference cycle time stamp TMDS_CTS is greater than the regenerated cycle time stamp APLL_CTS. On the contrary, the tracking circuit 38 increases the control signal FINE by one if the reference cycle time stamp TMDS_CTS is lesser than the regenerated cycle time stamp APLL_CTS. The coarse tune step may be performed frequently such that the regenerated audio clock (128*Fs) will be monitored and not deviated from the correct audio frequency.

Sometimes, the regenerated cycle time stamp APLL_CTS is kept close to the reference cycle time stamp TMDS_CTS. It means that the regenerated audio clock (128*Fs) is within a fine range of the video clock TMDS_CLK. In certain situations, the fluctuation between the regenerated cycle time stamp APLL_CTS and the reference cycle time stamp TMDS_CTS causes unstable problems. Accordingly, the fine tune step provides a compromise solution. In one embodiment, the tracking circuit 38 may accumulate the least significant bit of the regenerated cycle time stamp APLL_CTS and that of the reference cycle time stamp TMDS_CTS for a specific time. The tracking circuit 38 may increase or decrease the control signal FINE according to the comparison between 1) the accumulation APLL_CTS_ACC of the least significant bit APLL_CTS[0] of the regenerated cycle time stamp APLL_CTS and 2) the accumulation TMDS_CTS_ACC of the least significant bit TMDS_CTS[0] of the reference cycle time stamp TMDS_CTS.

Figure 5:
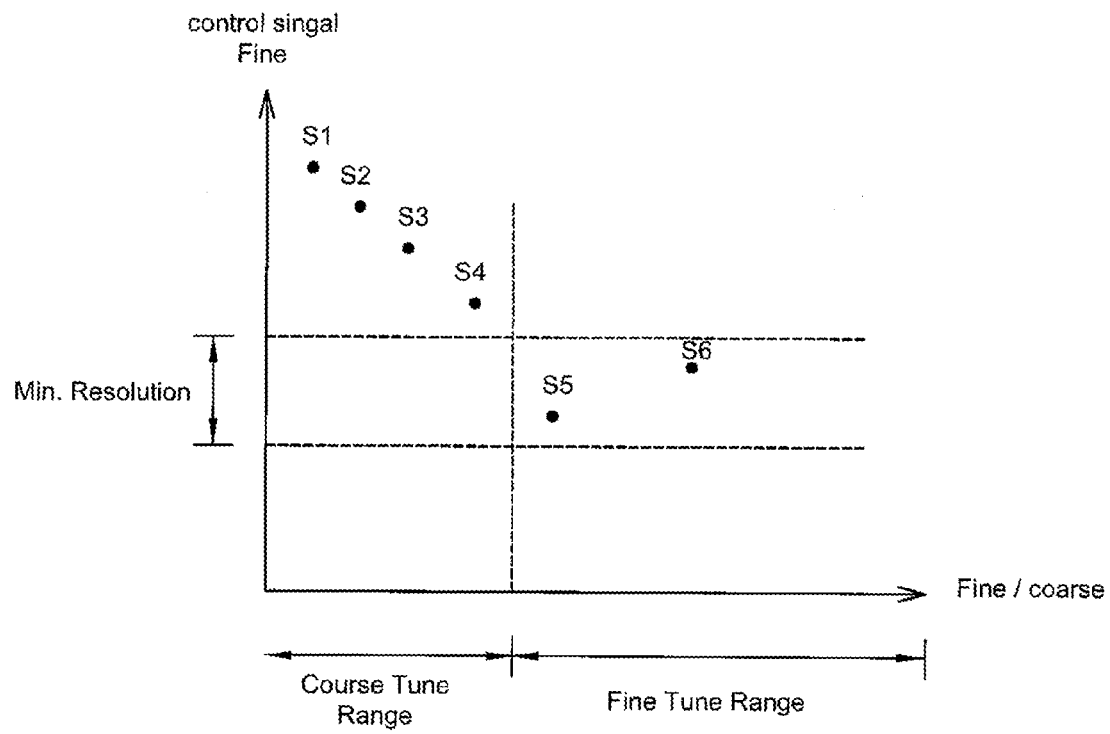
FIG. 5 illustrates the operations of the coarse and fine tune steps according to one embodiment of the invention.

FIG. 5 illustrates the coarse and the fine tune steps according to one embodiment of the invention. Assume the clock regenerator performs six tune steps S1-S6. Normally, the occurring sequence may be S1, S2, S3, S4, S5 and S6. Since the tune steps S1, S2, S3 and S4 are within the coarse tune range, the control signal FINE is adjusted according to the comparison result of the coarse tune step. When the tune steps are in the fine tune range, the control signal FINE can not be appropriately adjusted because the minimum resolution of the control signal FINE can not identify the difference between tune steps S5 and S6.

Figure 6:
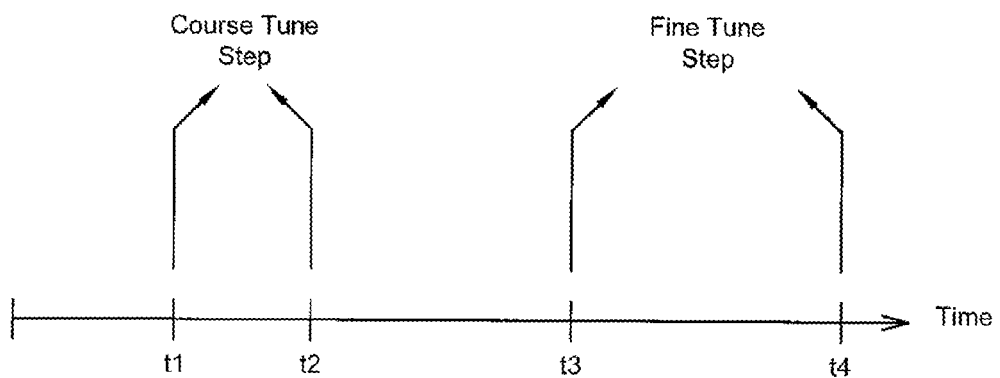
FIG. 6 illustrates the operations of the coarse and fine tune steps according to another embodiment of the invention.

FIG. 6 illustrates the operations of the coarse and the fine tune steps according to another embodiment of the invention. At time t1 and t2, the coarse tune steps are performed to tune the crystal oscillator when the reference cycle time stamp TMDS_CTS and the regenerated cycle time stamp APLL_CTS are different. At time t3 and t4, the fine tune steps are performed to tune the crystal oscillator when the reference cycle time stamp TMDS_CTS and the regenerated cycle time stamp APLL_CTS are equivalent or close. Various timing may be used when the fine tune steps are performed. For example, the time interval between the time t4 and time t3 may be longer than that between time t3 and time t2. The time interval may be about 1 millisecond.

According to one embodiment, a clock regenerator with a precise tracking mechanism can be used in a sink device of an HDMI (High Definition Multimedia Interface) system. The clock regenerator comprises an oscillator, a phase lock loop circuit, a counter and a tracking circuit. The counter receives a video clock and a cycle time parameter. It then extracts the period of an audio clock based on the video clock. The audio clock is a regenerated clock from the phase lock loop circuit. The input of the phase lock loop circuit is a crystal clock created by the oscillator. The tracking circuit compares the period extracted by the counter and the received cycle time parameter, and changes the frequency of the crystal clock of the oscillator.

The clock regenerator may further comprise a cycle time divider that divides the crystal clock based on the cycle time parameter before the crystal clock enters the phase lock loop circuit. Moreover, the tracking circuit may further comprise an accumulator to accumulate the difference between the cycle time parameter and the extracted period. For example, if the cycle time parameter and the extracted period are represented by digital bits, the accumulator may accumulate each least significant bit for precise frequency control. Therefore, the audio clock is regenerated and synchronized to the video clock.

It is to be understood that these embodiments are not meant as limitations of the invention, but merely exemplary descriptions. Indeed, different adaptations may be apparent to those skilled in the art without departing from the scope of the annexed claims. For instance, the charge pump of the phase lock loop circuit may be replaced by a loop filter circuit.

What is claimed is:

1. An audio clock regenerator for an HDMI sink device receiving a video clock, and a cycle time stamp value and a predetermined factor that are parameters for defining a fractional relationship between the video clock and an audio clock, the audio clock regenerator comprising:
    a digitally controlled crystal oscillator to generate a crystal clock;
    a divider to frequency divide said crystal clock;
    a phase lock loop circuit to generate an audio clock and to phase lock a feedback clock that is obtained by dividing said audio clock by said factor;
    a recovery circuit to generate a recovery cycle time stamp value using said video clock; and
    a tracking circuit to compare said recovery cycle time stamp value with said cycle time stamp value to tune said crystal clock of said crystal oscillator.

2. The clock regenerator as claimed in claim 1, wherein the frequency of said crystal clock increases when said cycle time stamp value is less than said recovery time stamp value.

3. The clock regenerator as claimed in claim 1, wherein the frequency of said crystal clock decreases when said cycle time stamp value is greater than said recovery time stamp value.

4. The clock regenerator as claimed in claim 1, wherein said recovery circuit comprises a divider and a cycle time counter wherein said divider receives a second recovery time stamp value and divides said audio clock into a slower clock signal.

5. The clock regenerator as claimed in claim 1, wherein said digitally controlled crystal oscillator comprises a divider.

6. The clock regenerator as claimed in claim 1, wherein said tracking circuit is adapted to accumulate the comparison result between said recovery time stamp value and said cycle time stamp value, and tune said crystal clock of said digitally controlled crystal oscillator.

7. The clock regenerator as claimed in claim 1, wherein said tracking circuit is adapted to accumulate, respectively, a least significant bit of said recovery time stamp value and a least significant bit of said cycle time stamp value for at least half millisecond, to compare the result of said accumulation, and to tune said crystal clock of said digitally controlled crystal oscillator according to said comparison result.

8. A clock regenerator for an HDMI sink device, comprising:
   a clock output;
   a clock input;
   a crystal oscillator to generate a crystal clock;
   a phase lock loop circuit to receive said crystal clock and to regenerate said clock output;
   an extraction circuit to receive said clock output and to compare said clock output to said clock input to generate a first ratio parameter; and
   an adjustment circuit to receive a second ratio parameter and to compare said second ratio parameter with said first ratio parameter in order to adjust said crystal clock of said crystal oscillator.

9. The clock regenerator as claimed in claim 8, wherein said extraction circuit comprises a divider and a cycle time counter, wherein said divider reduces said clock output based on a third ratio parameter, and said cycle time counter counts the frequency of said clock input according to said reduced clock output.

10. The clock regenerator as claimed in claim 8, wherein said crystal oscillator is controlled by said adjustment circuit digitally.

11. The clock regenerator as claimed in claim 8, wherein said adjustment circuit is adapted to accumulate, respectively, a least significant bit of said first ratio parameter and a least significant bit of said second ratio parameter, to compare the results of said accumulation, and to adjust said crystal clock of said crystal oscillator.

12. The clock regenerator as claimed in claim 8, wherein said adjustment circuit is adapted to accumulate a difference between said first ratio parameter and said second ratio parameter for at least half millisecond before adjusting said crystal clock of said crystal oscillator.

13. The clock regenerator as claimed in claim 8, wherein said phase lock loop circuit comprises a phase frequency detector, a charge pump, a voltage controlled oscillator, and a divider.

14. The clock regenerator as claimed in claim 8, wherein said crystal oscillator comprises a frequency divider.

15. A sink device in an HDMI system, comprising:
   a video clock and a cycle time parameter;
   an oscillator to generate a crystal clock;
   a phase lock loop circuit to regenerate an audio clock according to said crystal clock;
   a counter to extract a period of said audio clock based on said video clock; and
   a tracking circuit to compare the counting result of said counter with said cycle time parameter and to change said crystal clock of said oscillator.

16. The sink device as claimed in claim 15, wherein said oscillator comprises a divider.

17. The sink device as claimed in claim 15, wherein said counter comprises a divider that divides said audio clock based on said video clock before extracting the period of said audio clock.

18. The sink device as claimed in claim 15, wherein said tracking circuit comprises an accumulator that accumulates a least significant bit of said counting result and a least significant bit of said cycle time parameter.

19. The sink device as claimed in claim 18, wherein said tracking circuit changes said crystal clock of said oscillator according to the accumulation of said accumulator when said extracted period and said cycle time parameter are equivalent.

20. A clock recovery method for a sink device in an HDMI system, comprising the steps of:
   receiving a video clock and a cycle time parameter;
   generating a crystal clock;
   regenerating an audio clock according to said crystal clock, wherein a phase of said audio clock is synchronized with said crystal clock;
   extracting a period of said audio clock based on said video clock;
   comparing the extracted period to said cycle time parameter; and
   changing said crystal clock according to the comparison between said extracted period and said cycle time parameter.

21. The clock recovery method as claimed in claim 20, further comprising the steps of:
   dividing said audio clock based on said video clock before extracting the period of said audio clock; and
   accumulating a least significant bit of the extracted period and a least significant bit of said cycle time parameter when said extracted period and said cycle time parameter are equivalent.

* * * * *